United States Patent
Strauss

(10) Patent No.: US 6,255,851 B1
(45) Date of Patent: Jul. 3, 2001

(54) MULTI-VOLTAGE I/O BUFFER CLAMPING CIRCUIT

(75) Inventor: Mark S. Strauss, Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/366,977

(22) Filed: Aug. 4, 1999

(51) Int. Cl.[7] .............................................. H03K 19/0185
(52) U.S. Cl. ............................. 326/81; 326/83; 327/534
(58) Field of Search ................................. 326/80–81, 83, 326/86, 121, 119; 327/534, 535

(56) References Cited

U.S. PATENT DOCUMENTS

| | | | |
|---|---|---|---|
| 5,144,165 | * 9/1992 | Dhong et al. | 326/81 |
| 5,381,062 | 1/1995 | Morris | 326/68 |
| 5,424,659 | 6/1995 | Stephens et al. | 326/81 |
| 5,448,198 | * 9/1995 | Toyoshima et al. | 326/81 |
| 5,661,414 | * 8/1997 | Shigehara et al. | 326/81 |
| 5,854,561 | * 12/1998 | Arimoto et al. | 327/534 |
| 5,880,602 | * 3/1999 | Kaminaga et al. | 326/81 |

* cited by examiner

Primary Examiner—Patrick Wamsley
Assistant Examiner—Don Phu Le
(74) Attorney, Agent, or Firm—Synnestvedt & Lechner LLP

(57) ABSTRACT

A buffer circuit for mixed voltage applications. The circuit is built from field effect transistors and is used to interface with multiple voltage levels. The circuit uses a protection transistor in which the gate is controlled by a logic circuit having the mixed voltages as inputs. It is particularly useful on CMOS semiconductor chips that interface with multiple voltage levels which are required to conform to a specification allowing voltage levels to be powered down.

19 Claims, 1 Drawing Sheet

MULTI-VOLTAGE I/O BUFFER CLAMPING CIRCUIT

FIELD OF THE INVENTION

The present invention relates to input/output (I/O) buffer circuits that are compatible with multiple voltage levels.

BACKGROUND OF THE INVENTION

Conventional circuit components generally operate between approximately 3 and 5 volts. In recent history, circuit components were typically designed to operate at approximately 5 volts. Today, however, low voltage components which operate at approximately 3 volts are becoming more popular in circuit designs because of their low power consumption and high performance. Currently, it is often desirable to have a 3 volt circuit designed with 3 volt components to communicate with a 5 volt circuit designed with 5 volt components. Damage to circuits designed using 3 and 5 volt technologies can result from combining the technologies if appropriate steps are not taken to make them compatible.

In addition to damage resulting from interconnecting circuits designed in 3 and 5 volt technologies, over-voltages (voltages that are greater than the power supply voltage of a circuit) may also cause damage to circuitry. Over-voltages can be introduced to input/output circuitry by circuits which interface with the input/output circuit. For example, ringing may occur on a metal trace of a printed circuit board due to inductive effects which may cause over-voltages at the input/output interface to occur. Over-voltages may potentially damage both 3 and 5 volt circuits.

In order to provide a guide for developers in designing telecommunications equipment, specifications have been created to offer such developers connection standards for safely connecting circuits to one another. These specifications set forth requirements and conditions for connections. For example, requirements for active clamping (circuitry to prevent the voltage level from exceeding a certain value) and system power supply values may be set forth in a specification.

Standard specifications, such as the PCI bus specification (PCI Local Bus Specification, Revision 2.1) which is an industry standard, require that the output of an I/O buffer be actively clamped to guard against system over-voltages. Prior art circuits have been successful in protecting against system over-voltages by actively clamping the I/O port to the input/output bus power supply. A basic prior art I/O buffer circuit pull-up transistor with active clamping is shown in FIG. 1. The buffer circuit pull-up transistor 10 comprises a p-channel transistor 12. The p-channel transistor 12 has a gate 12A, source 12B, drain 12C, and back-gate 12D. Transistor 12 is connected as follows: gate 12A is connected to a signal which controls the transistor 12; source 12B is connected to a buffer circuit power supply, $V_{DD}$; drain 12C is connected to an I/O port; and back-gate 12D is connected to a destination.

Inherent to fabricated p-channel transistors age p-n junctions which create parasitic diodes 14 and 16 between the drain and the substrate, and between the source and the substrate, respectively. The parasitic diodes are illustrated in FIG. 1 at 14 and 16. One parasitic diode 14 is inherent to the fabricated junction between the source 12B and the back-gate 12D, and another parasitic diode 16 is inherent to the fabricated junction between the drain 12C and the back-gate 12D.

If $V_{IO}$ is at 5 volts (i.e., the bus is in 5 volt signaling mode) and $V_{DD}$ is at 3 volts, diode 14 is reversed bias and I/O port 18 can swing between 0 and 5 volts. Since diode 14 is reverse biased, no damaging currents will be allowed to flow through that junction, i.e., between the back-gate 12D and the source 12B. If the voltage level at the I/O port 18 swings above 5 volts, parasitic diode 16 clamps I/O port 18 to the back-gate 12D voltage level of 5 volts. Parasitic diode 16 provides active clamping to the input/output bus power supply, $V_{IO}$.

If $V_{IO}$ is at 3 volts (i.e., the bus is in 3 volt signaling mode) and $V_{DD}$ is at 3 volts, diode 14 is not biased and I/O port 18 can swing between 0 and 3 volts. Since diode 14 is not forward biased, no damaging currents will be allowed to flow through that junction. If the voltage level at the I/O port 18 swings above 3 volts, parasitic diode 16 clamps I/O port 18 to the back-gate 12D voltage level of 3 volts. Parasitic diode 16 provides active clamping to the input/output bus power supply, $V_{IO}$.

A recent specification (i.e., PCI Local Bus Specification, Revision 2.2) provides that in addition to actively clamping the I/O port, the PCI power supply will be allowed to be powered down (voltage allowed to go to ground). This presents a problem for basic prior art I/O buffer circuits. Given the circuit shown in FIG. 1, if the voltage, $V_{IO}$, at back-gate 12D is allowed to go to ground and the voltage, $V_{DD}$, at source 12B is at three volts, parasitic diode 14 will be heavily forward biased. The heavily forward biased parasitic diode 14 would pass sufficient current to destroy transistor 12. For example, MOS transistors would be damaged if they were subjected to a high current flow. In such a case, there is a potential for degraded reliability and damage to the MOS transistors contained in a 3 volt circuit due to the current created by the 3 volt potential between source 12B at 3 volts and back-gate 12D at ground.

Prior art circuits such as the circuit shown in FIG. 1 have been effective in accommodating multiple voltage levels and handling over-voltages, however, they do not conform to the most recent PCI specification (Release 2.2) which requires that the bus power supply be allowed to go to ground. Existing prior art circuits require that either the power supplies are always active, or they do not provide active clamping of the input port 18.

SUMMARY OF THE INVENTION

The present invention discloses an improved output portion of an input/output (I/O) buffer circuit that is compatible with multiple voltage levels. The buffer circuit provides active clamping to guard against system over-voltages by connecting the substrate of a pull-up transistor to an input/output bus power supply. It also contains protection circuitry which protects the circuit by isolating the input/output bus power supply from the substrate of the buffer circuit pull-up transistor in the event that the input/output bus power supply is powered down (i.e., goes to zero volts).

The protection circuitry is implemented by using voltage dividers, comparators, and logic gates to control a protection transistor. The logic gates are dependent on the voltage levels of the buffer circuit power supply and the input/output bus power supply. If the input/output bus power supply is allowed to go to ground, the protection transistor is turned off, which causes the buffer circuit pull-up transistor substrate to float rather than go to ground. Since the substrate of the pull-up transistor is floating, potentially damaging currents are prevented from flowing through the pull-up transistor.

DETAILED DESCRIPTION OF THE INVENTION

The present invention relates to an output buffer or the output portion of an input/output (I/O) buffer. Although, as will be apparent to those skilled in the art, the invention is described in terms of interfacing the output portion of an input/output buffer with a system bus according to peripheral component interconnect (PCI) specifications, the invention may be practiced in other mixed voltage circuits.

Figure 1:
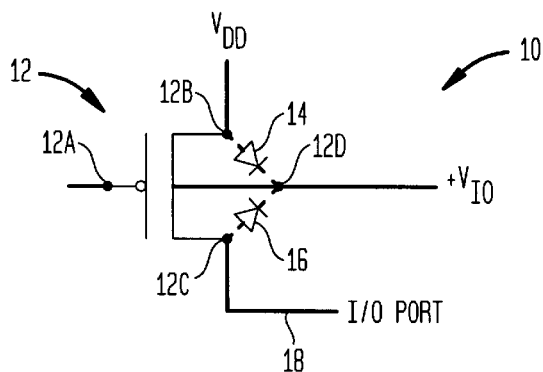
FIG. 1 is a circuit diagram of a prior art buffer circuit.
Figure 2:
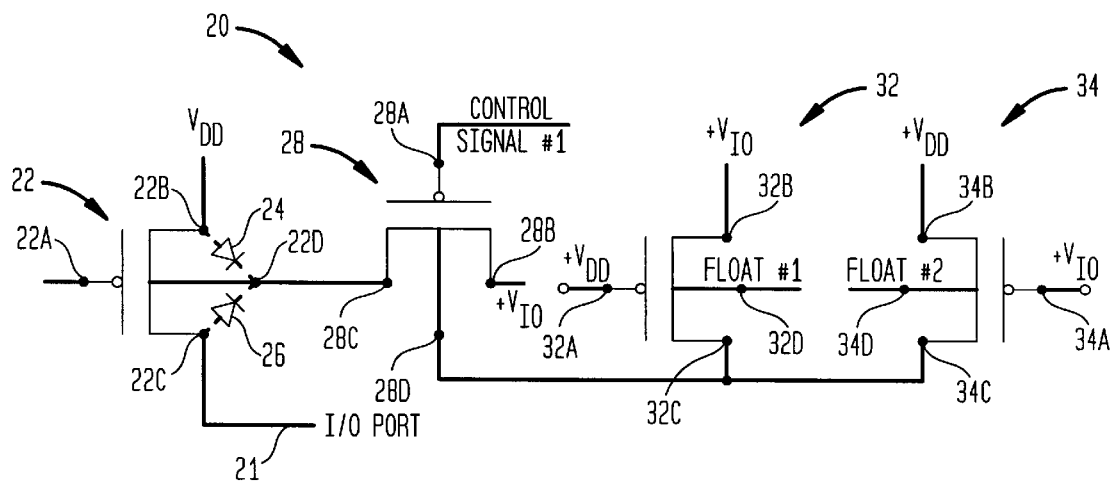
FIG. 2 is a circuit diagram of a buffer circuit in accordance with the present invention.

An output buffer 20 in accordance with the present invention is depicted in the circuit diagram of FIG. 2. In FIG. 2, a p-channel metal oxide semiconductor field effect transistor (PMOSFET) 22 is used to supply a signal to input/output (I/O) port 21 which interfaces with external components such as a PCI bus. It will be understood by one skilled in the art that PMOSFETs currently use a poly-silicon gate rather than a metal oxide gate which was historically used and from which the name was derived. The PMOSFET 22 is connected to a buffer supply voltage, $V_{DD}$, at its source contact 22B. For illustrative purposes, $V_{DD}$ will be assumed to be a low voltage supply operating at 3 volts. The drain contact 22C is connected to I/O Port 21 and the gate contact 22A is connected to circuitry which regulates the operation of PMOSFET 22 in order to place a desired signal onto I/O port 21. The back-gate 22D of PMOSFET 22 is connected through protection PMOSFET 28 to an input/output bus power supply $V_{IO}$, such as a PCI bus power supply. PMOSFET 22 also contains parasitic diodes 24 and 26. The parasitic diodes 24 and 26 are an inherent result of the p-n junctions which are created when fabricating a PMOSFET transistor.

Protection PMOSFET 28 is configured to operate as a source follower. A p-channel source follower operates as follows. As long as the gate 28A of a p-channel source follower is low in relation to its source 28B, the transistor 28 will be turned on. When transistor 28 is on, the resistance between the source 28B and the drain 28C is very low. If the gate 28A is high in relation to its source 28B, the transistor 28 will be off. When the transistor 28 is off, the resistance between the source 28B and the drain 28C is very high, effectively electrically isolating the source 28B from the drain 28C. Therefore, when transistor 28 is on, the voltage at the drain 28C follows the voltage at the source 28B; and when transistor 28 is off, the drain 28C is isolated. The source 28B is connected to a power supply, VIO. Since the back-gate 22D of PMOSFET 22 is connected to drain 28C of PMOSFET 28, by controlling the gate 28A of PMOSFET 28, the back-gate 22D of PMOSFET 22 can be electrically connected to $V_{IO}$ or allowed to float (maintain approximately the last voltage on the device before being allowed to float).

Parasitic diode 26, which is inherent to the p-n junction fabricated between the drain contact 22C and the back-gate contact 22D, provides active clamping of the I/O port 21 for buffer circuit 20. Active clamping is required by some specifications, such as PCI specifications (release 2.1 and 2.2), to prevent circuit damage in the event of over-voltages (voltages above the voltage level of the input/output bus power supply). Over-voltages may result from ringing on a metal trace of a printed circuit board due to inductive effects, for instance.

Ringing on a printed circuit board may create voltages that are more than 5 volts. Assuming that the voltage at the gate 28A of protection transistor 28 is less than the voltage at the source 28B of protection transistor 28, the protection transistor 28 is active. If protection transistor 28 is active, the resistance between the source 28B and the drain 28C is very low. Therefore, if $V_{IO}$ is at 5 volts and source 28B is connected to $V_{IO}$, the voltage at the source 28B and the drain 28C will be approximately 5 volts. Since the back-gate 22D is connected to drain 28C, the voltage at the back-gate 22D of transistor 22 will also be approximately 5 volts. If the voltage level on the I/O port 21, connected to the drain 22C of transistor 22, exceeds 5 volts due to ringing, parasitic diode 26 will be turned on. If parasitic diode 26 is on, the voltage level of the I/O port 21 will be actively clamped to the back-gate 22D, approximately 5 volts.

P-channel transistors 32 and 34 are used to control the voltage level of the back-gate 28D of protection transistor 28. Transistor 32 is connected to $V_{IO}$ through source contact 32B. The gate contact 32A is connected to $V_{DD}$ and the drain contact 32C is connected to the back-gate 28D of protection transistor 28. Transistor 34 is connected to $V_{DD}$ through source contact 34B. The gate contact 34A is connected to $V_{IO}$ and the drain contact 34C is connected to the back-gate 28D of protection transistor 28. The back-gate contacts 32D and 34D of transistors 32 and 34 are allowed to float (i.e., back-gate 32D is within a diode drop of source contact 32B and drain contact 32C, and back-gate 34D is within a diode drop of source contact 34B and drain contact 34C). If the back-gate of a p-channel transistor, such as transistors 32 and 34, is allowed to float, it will retain approximately the same voltage level as prior to being allowed to float. For illustrative purposes it is assumed that $V_{DD}$ equals 3 volts and $V_{IO}$ equals 0, 3, or 5 volts. The voltage levels at back-gate 28D for the different combinations of $V_{DD}$ and $V_{IO}$ are set forth in Table 1. As can be seen from table 1, the voltage level at back-gate 28D is maintained between 3 and 5 volts.

TABLE 1

Protection Transistor Back-Gate Voltage

| $V_{DD}$ | $V_{IO}$ | Transistor 32 | Transistor 34 | Back-gate 28D |
|---|---|---|---|---|
| 3V | 0V | Off | Active | 3V |
| 3V | 3V | Off | Off | Float (3V–5V) |
| 3V | 5V | Active | Off | 5V |

Figure 3:
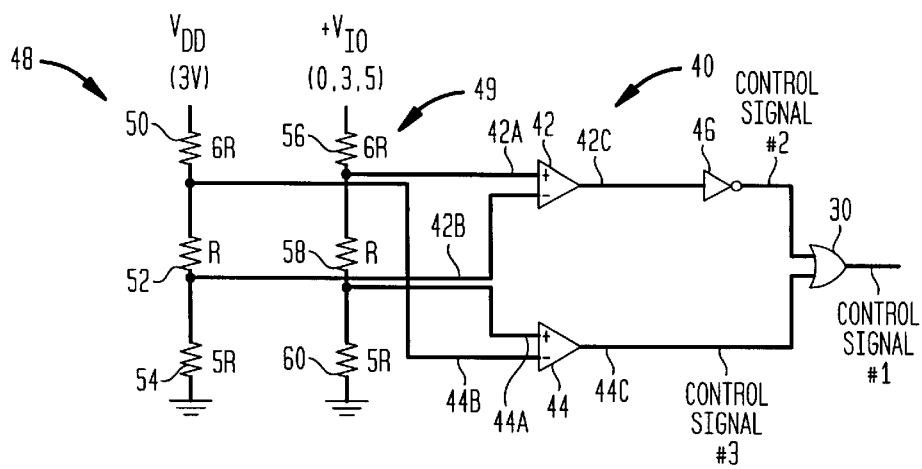
FIG. 3 is a circuit diagram of a control circuit for the buffer circuit of FIG. 2 in accordance with the present invention.

The gate contact 28A of protection transistor 28, and thereby the connection of back-gate 22D to $V_{IO}$, is controlled by the voltage divider and logic circuitry depicted in FIG. 3. In one embodiment, logic circuit 40 comprises buffer supply voltage, $V_{DD}$, voltage divider 48; input/output bus supply voltage, $V_{IO}$, voltage divider 49; comparators 42 and 44; inverter 46; and OR gate 30. Voltage divider 48 comprises resistors 50, 52, and 54 which are connected in series between $V_{DD}$ and ground. In a preferred embodiment, the value of resistor 52 is chosen to be approximately 2.75K Ohms. The value for resistors 50 and 54 are approximately 6 times and 5 times the resistance value of resistor 52, respectively. The resistance values are chosen such that half of the voltage is dropped across resistor 50 and $\frac{1}{12}$th of the voltage is dropped across resistor 52. Voltage divider 49 comprises resistors 56, 58, and 60 which are connected in series between $V_{IO}$ and ground. In a preferred embodiment, the value of resistor 58 is chosen to be 2.75K Ohms. The value for resistors 56 and 60 are approximately 6 times and 5 times the resistance value of resistor 58, respectively. The resistance values are chosen such that half of the voltage is dropped across resistor 56 and 1/12th of the voltage is dropped across resistor 58.

The voltage levels out of the voltage divider circuits 48 and 49 are used as inputs to comparators 42 and 44. The voltage out of voltage divider 48 after it has been dropped to one-half of $V_{DD}$ is connected to the inverting input 44B of comparator 44, and the voltage out of voltage divider 49 after it has been dropped to five-twelfths of $V_{IO}$ is connected to the non-inverting input 44A of comparator 44. The voltage out of voltage divider 49 after it has been dropped to one-half of $V_{IO}$ is connected to the non-inverting input 42A of comparator 42, and the voltage out of voltage divider 48 after it has been dropped to five-twelfths of $V_{DD}$ is connected to the inverting input 42B of comparator 42. The output 42C of comparator 42 is inverted by inverter 46 to develop control signal #2. The output 44C of comparator 44 is used to develop control signal #3. Control signal #2 and control signal #3 are combined by OR gate 30 to develop control signal #1 which is used to control the gate 28A of the protection transistor 28 in FIG. 2. The development of control signal #1 for various PCI bus voltages along with the effect on the back-gate 22D of transistor 22 can be seen in table 2.

TABLE 2

Logic Circuit Voltage Levels

| $V_{DD}$ | $+V_{IO}$ | Control Signal #2 | Control Signal #3 | Control Signal #1 | Back-gate 22D |
|---|---|---|---|---|---|
| 3V | 5V | 0V | 3V | 3V | 5V |
| 3V | 3V | 0V | 0V | 0V | 3V |
| 3V | 0V | 3V | 0V | 3V | Floating |

As can be seen in table 2, when $V_{DD}$ is at three volts and $V_{IO}$ is at 5 volts, control signal #1 is at 3 volts. Since control signal #1 is less than $V_{IO}$, protection transistor 28 is activated, pulling back-gate 22D to $V_{IO}$ or 5 volts. If the voltage level on I/O port 21 exceeds 5 volts, parasitic diode 26 will actively clamp the I/O port to 5 volts. Also, since parasitic diode 24 is reverse biased, the transistor 22 will not be harmed.

When $V_{DD}$ is at three volts and $V_{IO}$ is at 3 volts, control signal #1 is at 0 volts. Since control signal #1 is less than $V_{IO}$, protection transistor 28 is activated, pulling back-gate 22D to $V_{IO}$ or 3 volts. If the voltage level on I/O port 21 exceeds 3 volts, parasitic diode 26 will actively clamp the I/O port to 3 volts. Also, since parasitic diode 24 has equal potential on either side, the transistor 22 will not be harmed.

If $V_{DD}$ is 3 volts and $V_{IO}$ is allowed to go to ground (i.e., the power is turned off and a signal is not present), control signal #1 is at 3 volts. Since control signal #1 is greater than $V_{IO}$, protection transistor 28 is deactivated, allowing back-gate 22D to float. If back-gate 22D were tied to $V_{IO}$ parasitic diode 24 would be heavily forward biased, resulting in damage to transistor 22. However, since back-gate 22D is allowed to float, the parasitic diode 24 will not be forward biased and transistor 22 will be protected.

The logic used to develop control signal #1 may be produced by any means which results in a similar control signal #1 output for the different relationships between $V_{DD}$ and $V_{IO}$ shown in Table 1. For example, a NOR gate followed by an inverter could be used in place of OR gate 30 to create control signal #1 to manipulate gate 28A of transistor 28. Similar logic modifications will be readily apparent to those skilled in the art. The logic may also be generated by a programmed digital processor or another similar device.

The invention has been described in detail using p-channel MOSFET transistors, however, n-channel MOSFET transistors or a combination of p-channel and n-channel transistors would be equally effective with slight modifications that would be readily apparent to one skilled in the art. For example, n-channel transistors could be used in place of p-channel transistors by bootstrapping the outputs. For this reason, the drain and source of the transistors are referred to in the claims as the current flow terminals, and the gate is referred to as the control terminal. Various types of FET technologies currently available and to be developed in the future would be equally effective in practicing the invention.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A voltage buffer circuit for buffering a signal to a port comprising:

a pull-up transistor having a control terminal coupled to receive said signal, a back-gate, and current flow terminals, the current flow terminals of said pull-up transistor connected between a first power supply and said port;

a protection transistor, having a control terminal, a back-gate, and current flow terminals, connected to the back-gate of said pull-up transistor for electrically connecting the back-gate to a second power supply; and a logic circuit for controlling said protection transistor, such that the back-gate of said pull-up transistor is electrically connected and disconnected from said second power supply by said protection transistor;

wherein said logic circuit, operating through said protection transistor, electrically connects the back-gate of said pull-up transistor to said second power supply when said second power supply is active, and electrically disconnects the back-gate of said pull-up transistor from said second power supply when said second power supply is powered down.

2. The voltage buffer circuit of claim 1, wherein the control terminal of said protection transistor is operably connected to said logic circuit and the current flow terminals of said protection transistor are connected between said second power supply and the back-gate of said pull-up transistor, such that said logic circuit controls when the back-gate of said pull-up transistor receives said second power supply.

3. The voltage buffer circuit of claim 2, wherein said protection transistor and said pull-up transistor are p-channel MOSFETs.

4. The voltage buffer circuit of claim 2, further comprising a voltage level circuit connected to the back-gate of said protection transistor for regulating the voltage level of the back-gate of said protection transistor.

5. The voltage buffer circuit of claim 3, wherein said logic circuit has as inputs, voltage levels taken from a first voltage divider connected between said first power supply and ground and a second voltage divider connected between said second power supply and ground, such that said logic circuit controls the gate of said protection transistor based on the voltage levels of said first power supply and said second power supply.

6. The voltage buffer circuit of claim 5, wherein said logic circuit comprises;
   a first comparator having a first input connected to a first portion of said first voltage divider, a second input connected to a first portion of said second voltage divider, and an output;
   a second comparator having a first input connected to a second portion of said first voltage divider, a second input connected to a second portion of said second voltage divider, and an output;
   an inverter having an input connected to the output of said first comparator, and an output; and
   an OR gate having a first input connected to the output of said inverter, a second input connected to the output of said second comparator, and an output, wherein the output of said OR gate controls the control terminal of said protection transistor.

7. A buffer circuit for mixed voltage applications, the circuit comprising:
   a pull-up transistor having a control terminal coupled to receive a signal, a back-gate, and current flow terminals;
   an input/output port connected to one of the current flow terminals of said pull-up transistor;
   a first power supply connected to said input/output port through the current flow terminals of said pull-up transistor;
   a protection transistor, having a control terminal, a back-gate, and current flow terminals, connected to the back-gate of said pull-up transistor by one of the current flow terminals of said protection transistor,
   a second power supply connected to the back-gate of said pull-up transistor through the current flow terminals of said protection transistor; and
   a first control signal connected to the control terminal of said protection transistor, wherein said first control signal is derived from the voltage levels of said first power supply and said second power supply, and whereby said first control signal regulates the connection of the back-gate of said pull-up transistor to said second power supply such that said protection transistor electrically isolates said second power supply from the back-gate of said pull-up transistor when said second power supply is powered down.

8. The voltage buffer circuit of claim 7, wherein said protection transistor and said pull-up transistor are p-channel MOSFETs.

9. The buffer circuit for mixed voltage applications of claim 7, wherein said first control signal is generated by a control circuit comprising:
   a first voltage divider connected between said first power supply and ground and generating first and second reference voltages;
   a second voltage divider connected between said second power supply and ground and generating third and fourth reference voltages;
   a first comparator for generating an intermediate control signal having a first input coupled to receive said third reference voltage, a second input coupled to receive said second reference voltage, and an output;
   an inverter for generating a second control signal from said intermediate control signal;
   a second comparator for generating a third control signal having a first input coupled to receive said fourth reference voltage, a second input coupled to receive said first reference voltage, and an output; and
   a logic circuit for generating said first control signal responsive to said second control signal and said third control signal.

10. The voltage buffer circuit of claim 9, wherein said logic circuit comprises an OR gate.

11. The voltage buffer circuit of claim 10, further comprising:
   a voltage level circuit connected to the back-gate of said protection transistor, such that the voltage level of the back-gate is controlled.

12. The voltage buffer circuit of claim 11, wherein said voltage level circuit comprises:
   a first voltage level transistor having a control terminal connected to said first supply voltage, a back-gate that is allowed to float, and current flow terminals connected between said second supply voltage and the back-gate of said protection transistor; and
   a second voltage level transistor having a control terminal connected to said second supply voltage, a back-gate that is allowed to float, and current flow terminals connected between said first supply voltage and the back-gate of said protection transistor.

13. A method for interconnecting first and second circuits operating at different voltage levels comprising the steps of:
   connecting a protection transistor between a back-gate of a pull-up transistor of said first circuit and a first power supply;
   generating a control signal based on a comparison of a voltage level of a second power supply of said first circuit and a voltage level of said first power supply; and
   controlling said protection transistor with said control signal, wherein said protection transistor controls the connection between the back-gate of said pull-up transistor and said first power supply based on the voltage levels of said second power supply and said first power supply such that said protection transistor electrically isolates said first power supply from the back-gate of said pull-up transistor when said first power supply is powered down.

14. The method of claim 13, wherein said pull-up transistor and said protection transistor are p-channel MOSFETs.

15. The method for interconnecting first and second circuits operating at different voltage levels of claim 13, wherein said controlling step comprises:
   controlling a voltage level of a back-gate of said protection transistor based on the voltage levels of said second power supply and said first power supply.

16. A voltage buffer circuit for buffering a signal to a port comprising:
   a pull-up transistor having a control terminal coupled to receive said signal, a back-gate, and current flow terminals, the current flow terminals of said pull-up transistor connected between a first power supply and said port;
   a protection transistor, having a control terminal, a back-gate, and current flow terminals, connected to the back-gate of said pull-up transistor for electrically connecting the back-gate to a second power supply;

a voltage level circuit connected to the back-gate of said protection transistor for regulating the voltage level of the back-gate of said protection transistor; and a logic circuit for controlling said protection transistor, such that the back-gate of said pull-up transistor is electrically connected and disconnected from said second power supply by said protection transistor;

wherein the control terminal of said protection transistor is operably connected to said logic circuit and the current flow terminals of said protection transistor are connected between said second power supply and the back-gate of said pull-up transistor, such that said logic circuit controls when the back-gate of said pull-up transistor receives said second power supply.

17. The voltage buffer circuit of claim 16, wherein said protection transistor and said pull-up transistor are p-channel MOSFETs.

18. The voltage buffer circuit of claim 17, wherein said logic circuit has as inputs, voltage levels taken from a first voltage divider connected between said first power supply and ground and a second voltage divider connected between said second power supply and ground, such that said logic circuit controls the gate of said protection transistor based on the voltage levels of said first power supply and said second power supply.

19. The voltage buffer circuit of claim 18, wherein said logic circuit comprises;

a first comparator having a first input connected to a first portion of said first voltage divider, a second input connected to a first portion of said second voltage divider, and an output;

a second comparator having a first input connected to a second portion of said first voltage divider, a second input connected to a second portion of said second voltage divider, and an output;

an inverter having an input connected to the output of said first comparator, and an output; and an OR gate having a first input connected to the output of said inverter, a second input connected to the output of said second comparator, and an output, wherein the output of said OR gate controls the control terminal of said protection transistor.

* * * * *